(12) United States Patent
Blomme et al.

(10) Patent No.: US 6,784,484 B2
(45) Date of Patent: Aug. 31, 2004

(54) INSULATING BARRIER, NVM BANDGAP DESIGN

(75) Inventors: Pieter Blomme, Turnhout (BE); Bogdan Govoreanu, Otesani (RO); Maarten Rosmeulen, Leuven (BE)

(73) Assignee: Interuniversitair Micoroelektronica Centrum (IMEC, vzw), Leuven (BE)

( * ) Notice: Subject to any disclaimer, the term of this patent is extended or adjusted under 35 U.S.C. 154(b) by 0 days.

(21) Appl. No.: 10/131,923

(22) Filed: Apr. 25, 2002

(65) Prior Publication Data

US 2002/0190311 A1 Dec. 19, 2002

Related U.S. Application Data

(60) Provisional application No. 60/287,192, filed on Apr. 27, 2001.

(30) Foreign Application Priority Data

Oct. 19, 2001 (EP) .............................. 01204106

(51) Int. Cl.[7] .............................................. H01L 29/788
(52) U.S. Cl. ...................... 257/321; 257/324; 257/315; 257/637; 257/638; 257/314; 438/263; 438/464; 438/594
(58) Field of Search .................. 257/321, 324–326, 257/315, 637, 638, 314; 438/263, 464, 594

(56) References Cited

U.S. PATENT DOCUMENTS

| | | | |
|---|---|---|---|
| 4,015,281 A | | 3/1977 | Nagata et al. |
| 5,583,810 A | | 12/1996 | Van Houdt et al. |
| 5,907,183 A | * | 5/1999 | Takeuchi ............. 257/640 |
| 6,121,654 A | | 9/2000 | Likharev |

OTHER PUBLICATIONS

Houssa et al., "Trap–assisted tunneling in high permittivity gate dielectric stacks," Journal of Applied Physics, 87(12), pp. 8615–8620 (2000).
Kuo et al., "Study of sputtered $HfO_2$ thin films on silicon," Thin Solid Films, 213(2), pp. 257–264 (1992).
Vogel et al., "Modeled Tunnel Currents for High Dielectric Constant Dielectrics," IEEE Transactions on Electron Devices, 45(6), pp. 1350–1355 (1998).
Copy of European Search Report EP 01 20 4106.
Irrera, Fernanda and Russo, Felice., *Enhanced Injection in $n^{++}$–poly/$SiO_x$/$SiO_2$/p–Sub MOS Capacitors for Low–Voltage Nonvolatile Memory Applications*: IEEE Transaction on Electron Devices, vol. 46, No. 12, Dec. 1999.
Irrera, Fernanada and Marangelo, Luca. *Transport Model In $n^{++}$–poly/$SiO_x$/$SiO_2$/p–sub MOS Capacitors for Low–Voltage Nonvolatile Memory Applications*, IEEE Transactions on Electron Devices, vol. 47, No. 2, Feb. 2000.

* cited by examiner

*Primary Examiner*—Nathan J. Flynn
*Assistant Examiner*—Remmon R. Fordé
(74) *Attorney, Agent, or Firm*—McDonnell Boehnen Hulbert & Berghoff LLP

(57) ABSTRACT

An insulating barrier extending between a first conductive region and a second conductive region is disclosed. The insulating barrier is provided for tunnelling charge carriers from the first to the second region, the insulating barrier comprising a first portion contacting the first region and a second portion contacting the first portion and extending towards the second region, the first portion being substantially thinner than the second portion, the first portion being constructed in a first dielectric and the second portion being constructed in a second dielectric different from the first dielectric, the first dielectric having a lower dielectric constant than the second dielectric.

14 Claims, 17 Drawing Sheets

INSULATING BARRIER, NVM BANDGAP DESIGN

REFERENCE TO RELATED APPLICATIONS

This application claims priority benefits to U.S. provisional application Serial No. 60/287,192, filed on Apr. 27, 2001, entitled "Insulating Barrier." This application also claims priority to European Patent Application EP 01204106.7 filed on Oct. 19, 2001. This application incorporates by reference U.S. provisional application Serial No. 60/287,192 in its entirety. This application also incorporates by reference European Patent Application EP 01204106.7 in its entirety.

FIELD OF THE INVENTION

The present invention relates to an insulating barrier provided for tunnelling electrons from a first conductive region to a second conductive region according to the preamble of the first claim.

BACKGROUND OF THE INVENTION

Such an insulating barrier is for example used in a non-volatile memory (NVM) device, in which the first conductive region is for example a floating gate. In such memory devices it is desired that charge which is put on the floating gate can remain there for a long period of time, (for example 10 years) which period is referred to as the retention time. On the other hand it is desired that the charge can be removed from the floating gate by tunnelling in a very short time (for example in the order of milli- or microseconds), which time is referred to as the erase time, or transferred to the floating gate by tunnelling in an even shorter time (for example in the order of microseconds), which time is referred to as the write time. In order to achieve such short write/erase times, a suitable tunnelling voltage is applied over the insulating barrier, which is above the maximum read-disturbance voltage (i.e. the maximum voltage at which no significant undesired tunnelling occurs). This suitable tunnelling voltage is strongly dependent on the dielectric material in which the barrier is constructed and by its thickness.

Conventionally, the insulating barrier is constructed as a single layer of a dielectric material. The material and the thickness of the layer are chosen in function of a desired compromise between, on the one hand, obtaining a maximum read disturbance voltage as high as possible and, on the other hand, making it possible to write or erase the floating gate by applying a voltage as low as possible. Such a single-layer insulating barrier has an energy band diagram as shown in FIGS. 2 and 3, FIG. 2 showing the diagram in absence of a voltage applied over the barrier and FIG. 3 showing the diagram upon applying the tunnelling voltage. FIG. 3 clearly shows that the tunnelling voltage of the single-layer insulating barrier is undesirably high.

An insulating barrier which requires a lower voltage for tunnelling is for example known from U.S. Pat. No. 6,121,654. This document discloses a non-volatile memory device having an insulating barrier which is constructed as a three-layered structure. A first layer and a third layer of the insulating barrier are constructed in a low-barrier material and a second layer which is interposed between the first and third layers is constructed in a high-barrier material. As a result, the insulating barrier has a stepped energy band diagram with a lower level over the first and third layers and a higher level over the second layer (see FIGS. 5 and 6). The low- and high-barrier materials have substantially the same dielectric constant. As a consequence, the energy band diagram of the barrier during tunnelling has substantially the same inclination over the three layers. By applying the low-barrier material between the first conductive region, i.e. the floating gate, and the high-barrier material of the second layer, it is achieved that the peak of the energy band diagram during tunnelling is reduced with respect to that of a single-layer insulating barrier. As a result, the tunnelling voltage of the insulating barrier is reduced with respect to that of the single-layer insulating barrier.

However, the insulating barrier described in U.S. Pat. No. 6,121,654 has the disadvantage that such a barrier cannot easily be constructed, as there are only few suitable material combinations, and that all of these combinations have practical problems. U.S. Pat. No. 6,121,654 describes only one possible combination, namely $Si_3N_4$ as low-barrier material and AlN as high-barrier material. Depositing an AlN-layer is mostly done by epitaxial growth, wherein the ordered structure of the underlying layer is used as a template to assemble a high quality AlN layer. However, $Si_3N_4$ does not have the required ordered structure and therefore the structure of the AlN layer that is deposited on a $Si_3N_4$ layer will have defects that can compromise the long term data retention. Hence AlN is not a suitable material for constructing such an insulating barrier.

Aim of the Invention

It is an aim of the invention to provide an insulating barrier which can more easily be constructed and with which the tunnelling voltage can be reduced.

SUMMARY OF THE INVENTION

The insulating barrier according to one aspect of the invention comprises a first portion contacting the first region and a second portion contacting the first portion and extending towards the second region. The first portion is substantially thinner than the second portion. The first portion is constructed in a first dielectric and the second portion in a second dielectric which differs from and has a higher dielectric constant than the first dielectric. Due to the higher dielectric constant of the second portion, the first portion will have a larger voltage drop than the second portion when a voltage is applied over the insulating barrier. In other words, the electric field over the first portion will be stronger than the electric field over the second portion. As a result, the energy band diagram over the first portion has a stronger voltage dependence than the energy band diagram over the second portion, i.e. the energy band diagram upon applying a suitable voltage for tunnelling will show a steeper inclination over the first portion than over the second portion. In this way, less tunnelling voltage is required with respect to the single-layer insulating barrier of the prior art in order to reduce the energy barrier during tunnelling by the same amount. Furthermore, as the first portion is substantially thinner than the second portion, the profile during tunnelling comprises a larger part with the more shallow inclination, which implies that the tunnelling voltage can be reduced by a substantial amount with respect to the single-layer insulating barrier.

Suitable material combinations for the insulating barrier of the invention are for example $SiO_2$ or $Si_3N_4$ for the first portion and $Al_2O_3$, $HfO_2$ or $ZrO_2$ for the second portion. The second portion can for example be deposited by a technique such as atomic layer chemical vapour deposition (ALCVD), which can easily be achieved. Furthermore, $Al_2O_3$, $HfO_2$ and $ZrO_2$ are high-barrier materials which are currently considered for use in standard silicon semiconductor technology, for example in the standard CMOS transistor process, in contrary to the AlN which is used in the barrier of U.S. Pat. No. 6,121,654 and is not a commonly used or considered material in silicon technology. As a result, the insulating barrier of the invention can be constructed more easily, as the use of additional materials which are not already used in the normal transistor manufacturing process can be avoided. Of course, any other material combinations which are deemed suitable to the person skilled in the art may also be used in the insulating barrier of the invention.

The first and second dielectrics in which the first and second portions of the insulating barrier according to the invention are constructed preferably each comprise a single dielectric material. However, the first and second dielectrics may each also comprise a plurality of suitable dielectric materials which are stacked on top of each other, as long as the average dielectric constant of the first portion is lower than the average dielectric constant of the second portion.

Preferably, the material and the thicknesses of the first and second portions are chosen such that, upon applying a voltage suitable for tunnelling over the insulating barrier, the voltage drop over the first portion is higher than the voltage drop over the second portion. This has the advantage that the largest part of the tunnelling voltage will be dropped over the first portion, which is substantially thinner than the second portion. As a result, the tunnelling voltage can be further reduced.

In a first preferred embodiment of the insulating barrier according to the invention, the insulating barrier further comprises a third portion extending between the second portion and the second region. This third portion is substantially thinner than the second portion and is constructed in a third dielectric, which has a lower dielectric constant than the second dielectric. In this way, the insulating barrier is suitable for tunnelling in both directions, i.e. from the first to the second region as well as from the second to the first region.

The third portion is preferably constructed with substantially the same thickness as the first portion and preferably also in the same dielectric material as the first portion, so that the insulating barrier has a symmetrical structure. However, the thickness and the dielectric of the third portion may also be different from that of the first portion, while tunnelling in both directions can still be enabled.

In the first preferred embodiment, the dielectrics of the three portions are preferably chosen such that, in absence of a voltage difference over the insulating barrier, the three portions have substantially the same potential energy barrier. This has the advantage that the energy band diagram does not comprise any steps, so that during tunnelling the diagram descends monotonously. In this way it can be achieved that the second portion during tunnelling does not form an additional barrier, as is for example the case with the insulating barrier of U.S. Pat. No. 6,121,654 (see FIG. 6). Furthermore, this implies that, in absence of a voltage difference over the insulating barrier, the first and third portions provide an additional energy barrier to the energy barrier which is formed by the second portion, as the potential energy level of the first and third portions is sufficiently high to avoid electrons travelling to the first and third portions by thermionic emission, which can for example occur in the first and third layers of the insulating barrier of U.S. Pat. No. 6,121,654 which have a lower potential energy barrier than the second (interposed) layer. As a result, the thickness of the second portion can be reduced in the insulating barrier of the invention with respect to the insulating barrier known from U.S. Pat. No. 6,121,654.

In a second preferred embodiment of the invention, the insulating barrier comprises first and second portions of which the dielectrics are chosen such that, in absence of a voltage difference over the insulating barrier, the first portion has a higher potential energy barrier than the second portion. In other words, the energy band diagram of the insulating barrier has a stepped profile with a higher step over the first portion than over the second portion. This has the advantage that the voltage dependence of the insulating barrier can be further increased, as the profile comprises a vertically descending part between the first and second portions. This enables direct tunnelling instead of Fowler-Nordheim tunnelling through the first portion. In this way, the voltage which is required for tunnelling can be further reduced. This second embodiment also has the advantage that the energy band diagram during tunnelling descends monotonously, with the same advantages as mentioned in respect of the first embodiment described above.

The present invention also relates to non-volatile memory devices comprising the insulating barrier according to any one of the claims 1–8 and having a charge storage region as first conductive region and a charge supply region as second conductive region, or vice versa. The charge storage region can be a floating gate or a layer of localised storage traps, or any other charge storage region known to the person skilled in the art.

BRIEF DESCRIPTION OF THE DRAWINGS

The invention will be further elucidated by means of the following description and the appended figures.

DETAILED DESCRIPTION OF THE INVENTION

Figure 1:
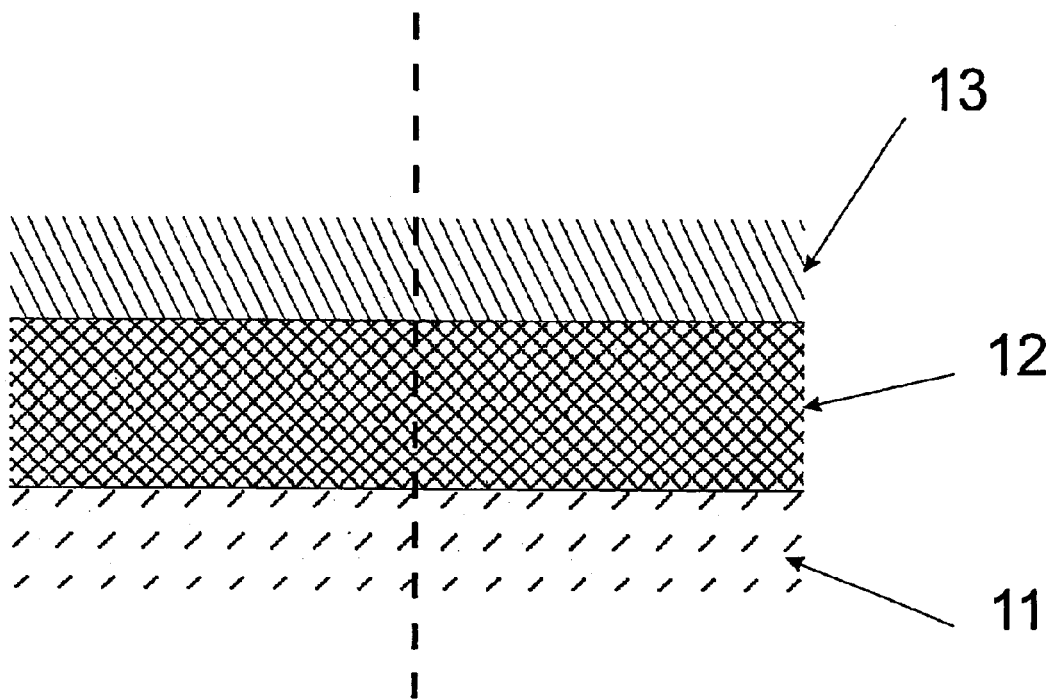
FIG. 1 shows a cross-section of a prior art single-layer insulating barrier.
Figure 2:
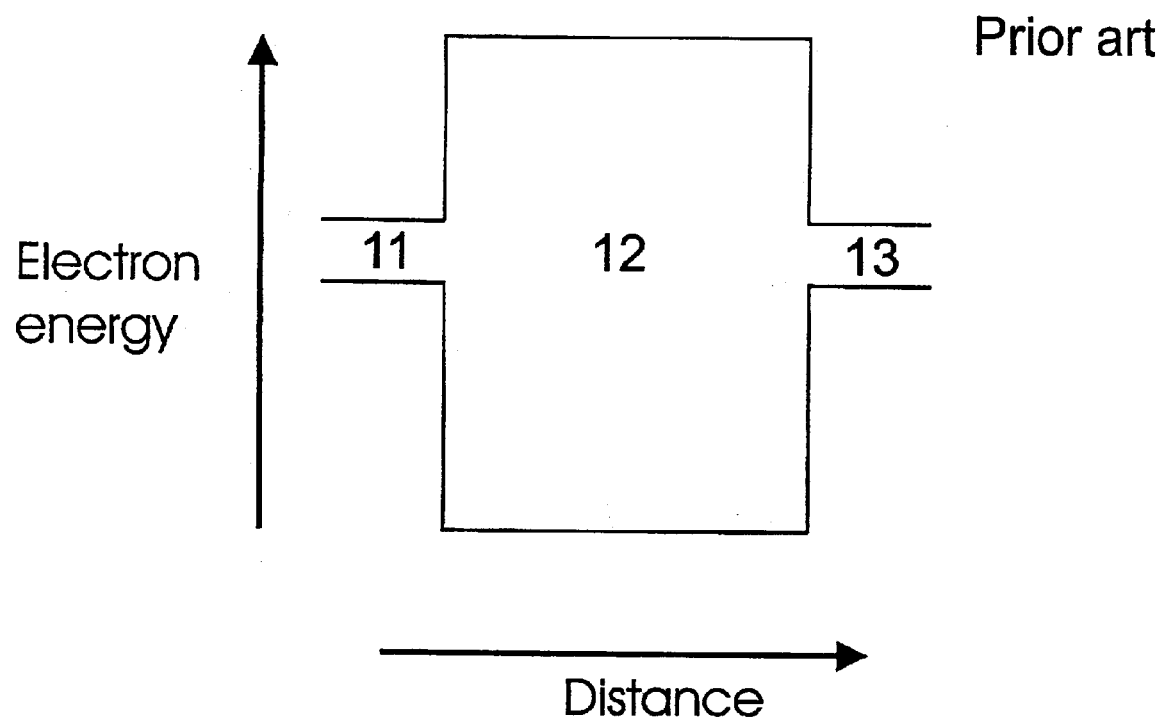
FIG. 2 shows the energy band diagram of the insulating barrier of FIG. 1 when no voltage is applied.
Figure 3:
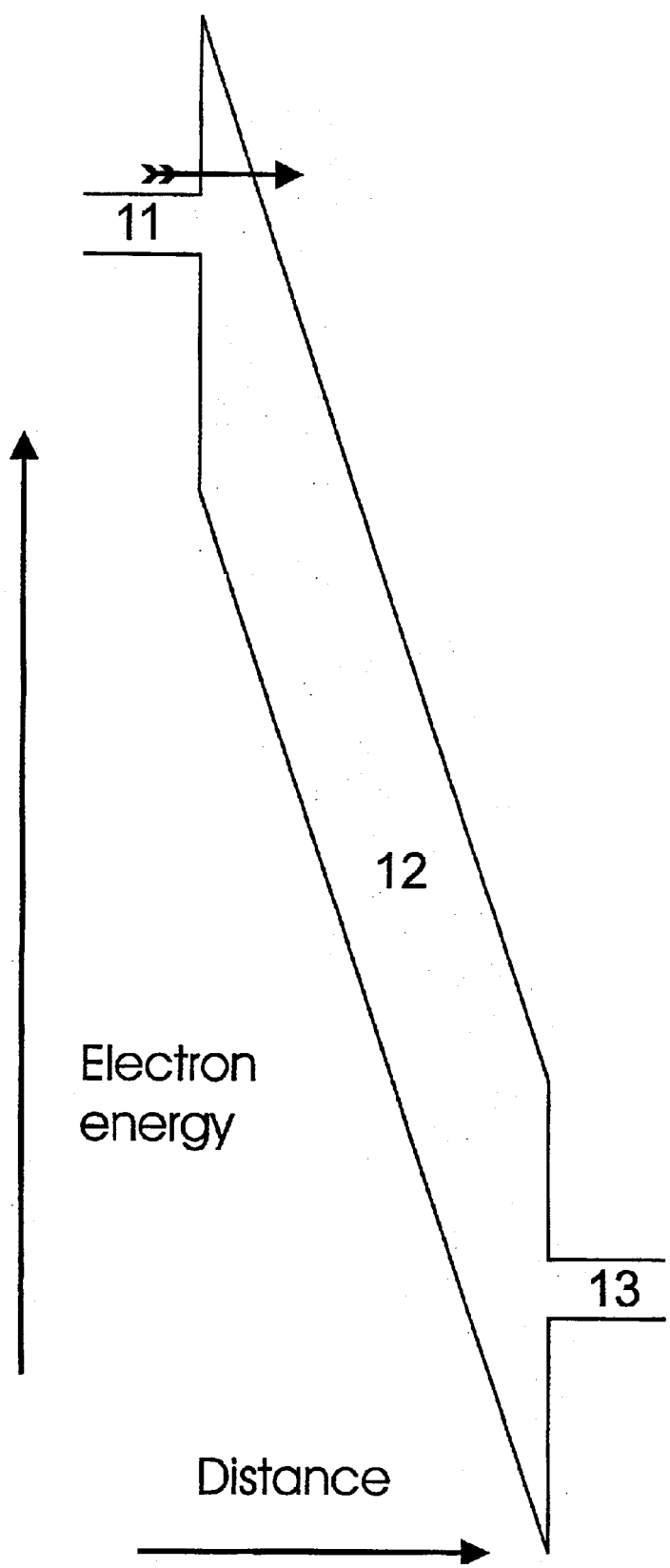
FIG. 3 shows the energy band diagram of the insulating barrier of FIG. 1 when a tunnelling voltage is applied.
Figure 4:
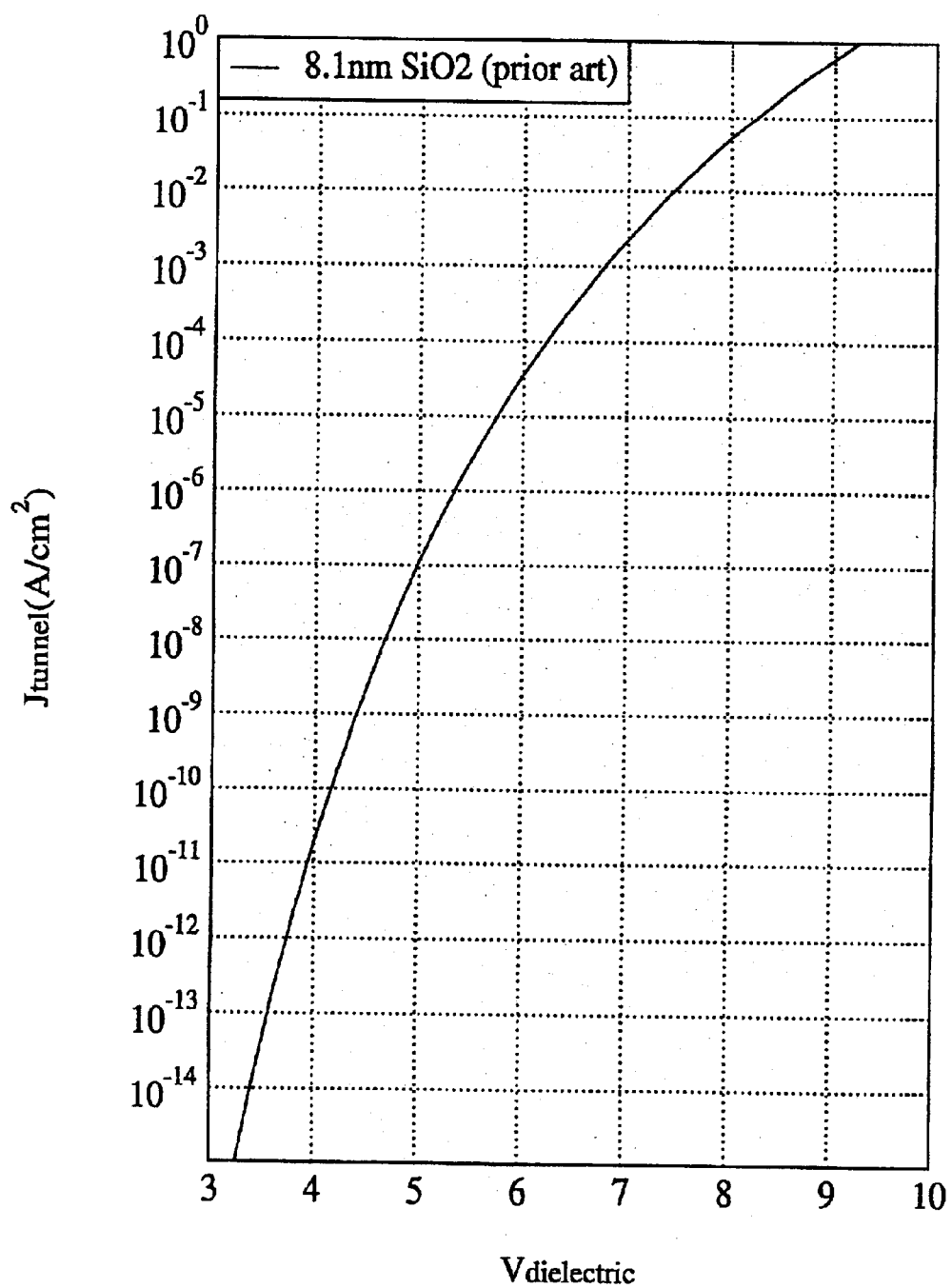
FIG. 4 is a plot of the current-voltage characteristic for the insulating barrier of FIG. 1.
Figure 5:
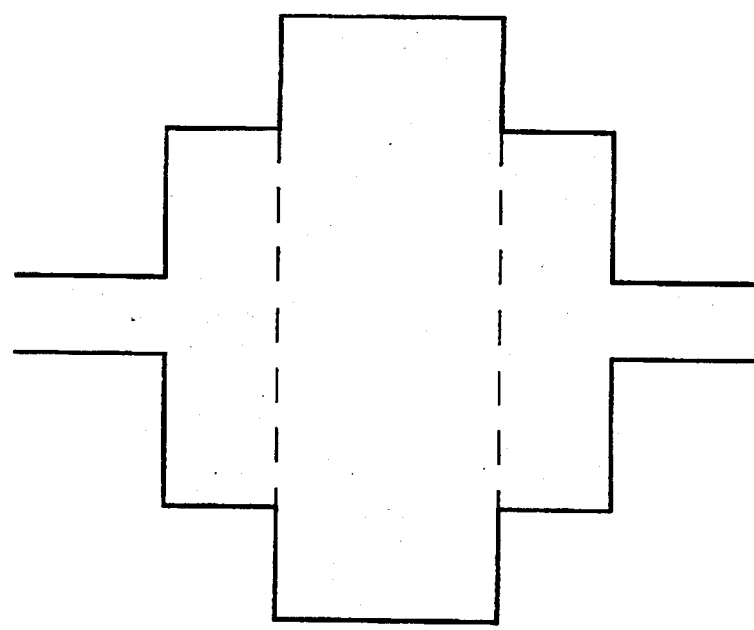
FIG. 5 shows the energy band diagram of a second prior art insulating barrier when no voltage is applied.
Figure 6:
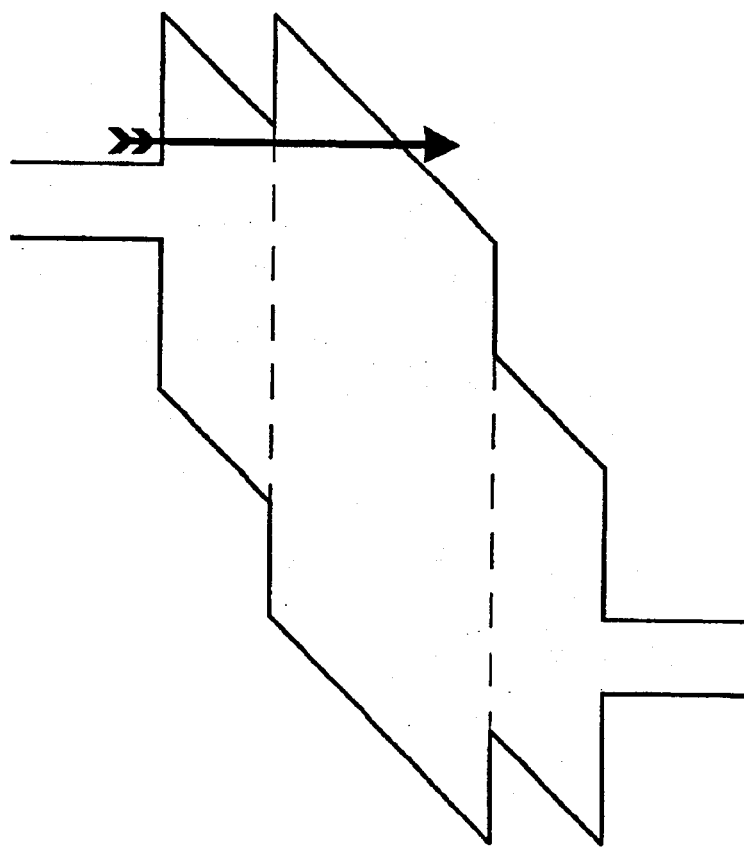
FIG. 6 shows the energy band diagram of the second prior art insulating barrier when a tunnelling voltage is applied.
Figure 7:
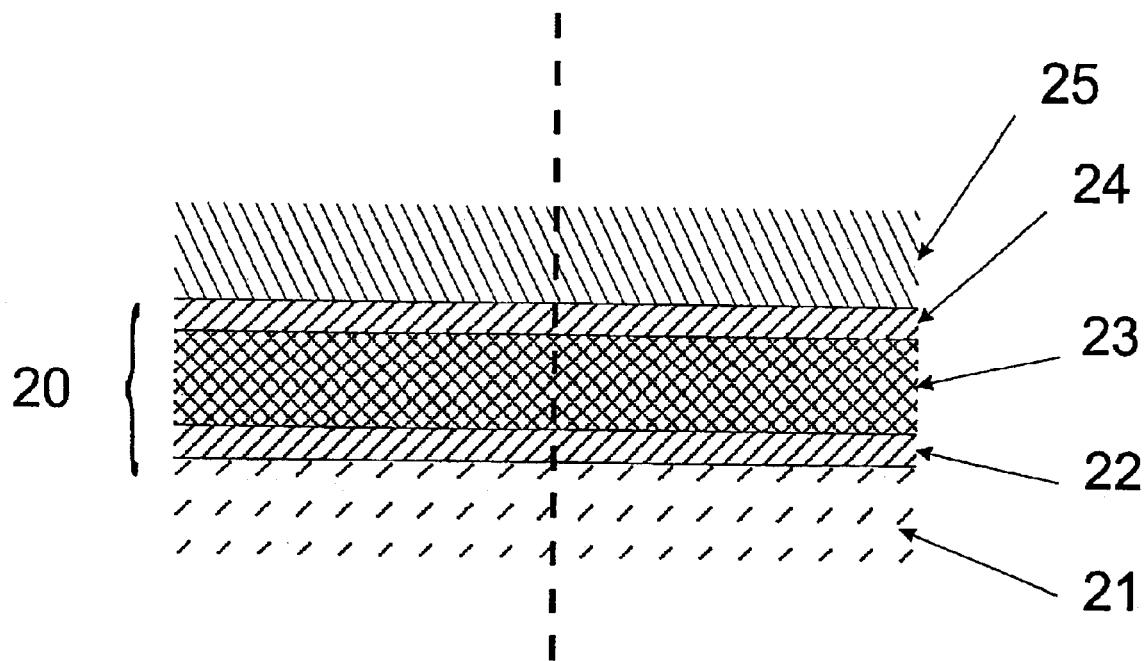
FIG. 7 shows a cross-section of a first embodiment of the insulating barrier according to the invention.

Referring to FIG. 7, there is shown a first embodiment of the insulating barrier. The insulating barrier 20 extends between a first conductive region 21 and a second conductive region 25 and comprises first, second and third layers 22, 23 and 24, which are formed on top of each other. The first and third layers 22 and 24 are preferably constructed in a first dielectric material having a low dielectric constant. The second layer 23 is substantially wider than the first and third layers 22 and 24 and is constructed in a second dielectric material having a higher dielectric constant than the first dielectric material.

Figure 8:
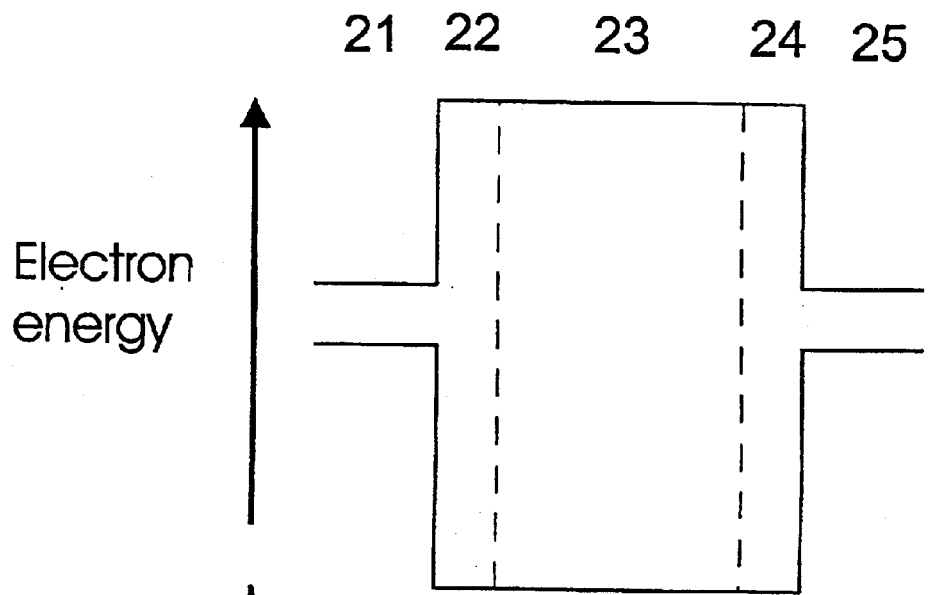
FIG. 8 shows the energy band diagram of the first embodiment when no voltage is applied.
Figure 9:
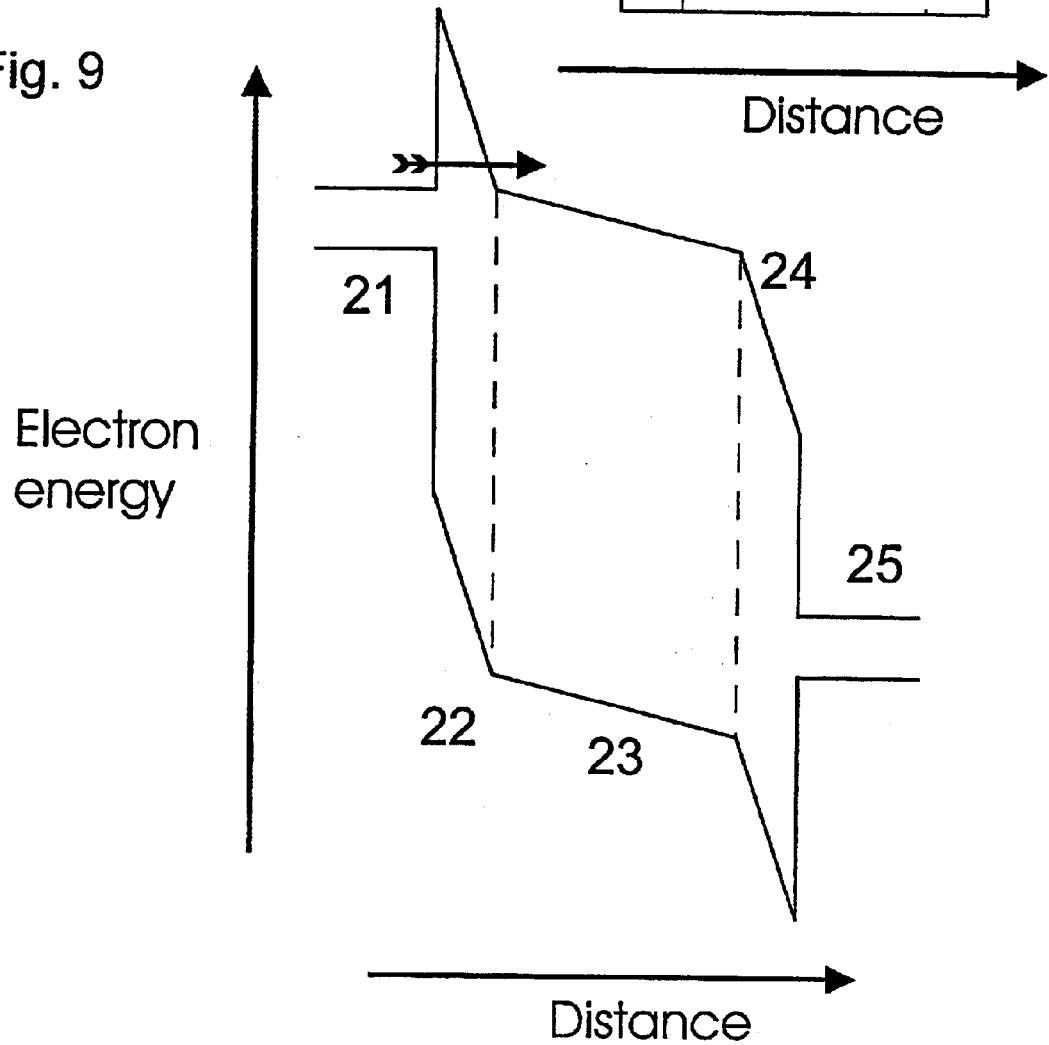
FIG. 9 shows the energy band diagram of the first embodiment when the tunnelling voltage is applied.

The first and second dielectric materials are chosen such that the insulating barrier 20 has a energy band diagram as shown in FIG. 8, when no voltage is applied over the barrier, and as shown in FIG. 9, when the tunnelling voltage is applied over the barrier. In order to achieve the profile shown in FIG. 8, the first and second dielectric materials are chosen such that they have substantially the same conduction band offset and bandgap. The profile shown in FIG. 9 is achieved by choosing the dielectric materials such that the first dielectric material has a lower dielectric constant than the second dielectric material and that, upon applying a voltage suitable for tunnelling over the insulating barrier 20, the voltage drop over the first layer 22 is higher than the voltage drop over the second layer 23.

The third layer 24 with substantially the same thickness as the first layer 22 and constructed in the same dielectric material as the first layer 22 is provided in order to achieve an insulating barrier 20 with a symmetrical structure. In this way, the insulating barrier 20 is suitable for tunnelling in both directions, i.e. from the first conductive region 21 to the second conductive region 25 and vice versa.

The first and second conductive regions 21 and 25 are constructed in a conductive or semiconductive material. The first conductive region 21 is for example a conductive layer constructed in heavily doped polysilicon (for example degenerately doped polysilicon having a doping concentration of more than $10^{19}/cm^3$), but may also be a semiconductor substrate. If the first conductive region 21 is a polysilicon base layer, it is generally deposited, on top of other material layers, on a semiconductor substrate. The semiconductor substrate typically comprises single crystal silicon.

The first layer 22 with a low dielectric constant is preferably constructed in silicon oxide, or silicon oxynitride with a low nitrogen concentration. The second layer 23 with a high dielectric constant is preferably constructed in a metal oxide like aluminium oxide or zirconium oxide. The third layer 24 is preferably constructed in the same material as the first layer 22 in order to obtain symmetric tunnelling properties, but it may also be constructed in another material of a similar type.

The thickness of the second layer 23 is chosen to be sufficient to block the flow of charge carriers when no voltage or a voltage below the maximum read-disturbance voltage is applied over the insulating barrier 20. Typically this thickness is chosen in the range of 4–20 nm. This second layer can for example be deposited by a technique such as atomic layer chemical vapour deposition (ALCVD).

The operation of the insulating barrier of FIG. 7 is described in the following, with reference to the band diagrams of this structure without bias (FIG. 8) and when a high programming voltage is applied (FIG. 9).

The thickness of the first layer 22 and third layer 24 of this dielectric stack are chosen in function of the difference in energy band level between the first conductive region 21 and the second layer 23. In order to achieve high tunnelling currents through the insulating barrier 20, the thickness of the first layer is chosen to be sufficient to allow the energy of electrons in the bottom of the conduction band of the second dielectric layer 23 to drop below the energy of electrons in the bottom of the conduction band of the first conductive region 21 (in case it is constructed in a semiconductive material) or its metal work function (in case it is constructed in a conductive material). Similarly, the thickness of the third layer 24 is chosen to be sufficient to allow the energy of electrons at the bottom of the conduction band of the second dielectric layer 23 to drop below the energy of electrons in the bottom of the conduction band or the metal work function of the second conductive region 25. In this way, the tunnelling current is determined by the tunnelling through only the first layer 22 or the third layer 24. The same relation is also valid when tunnelling of holes is used, but in this case, the energy of the holes in the top of the valence bands should be used instead of the energy of the electrons at the bottom of the conduction band.

For example, if the materials used are silicon dioxide for the first and the third layers 22 and 24, and aluminium oxide for the second layer 23, the thickness of the first and third layers is chosen in the range of 2–3 nm. The thickness of the second layer 23 is chosen such that the flow of an electric current through the barrier 20 at low electrical fields or voltages below the maximum read-disturbance voltage can be prevented. For this purpose, the thickness of this layer 23 is preferably chosen in the range from 6 to 20 nanometers. Higher thicknesses are counterproductive since it is preferable that a large part of the voltage applied over the barrier 20 is dropped over the first and third dielectric layers.

Figure 10:
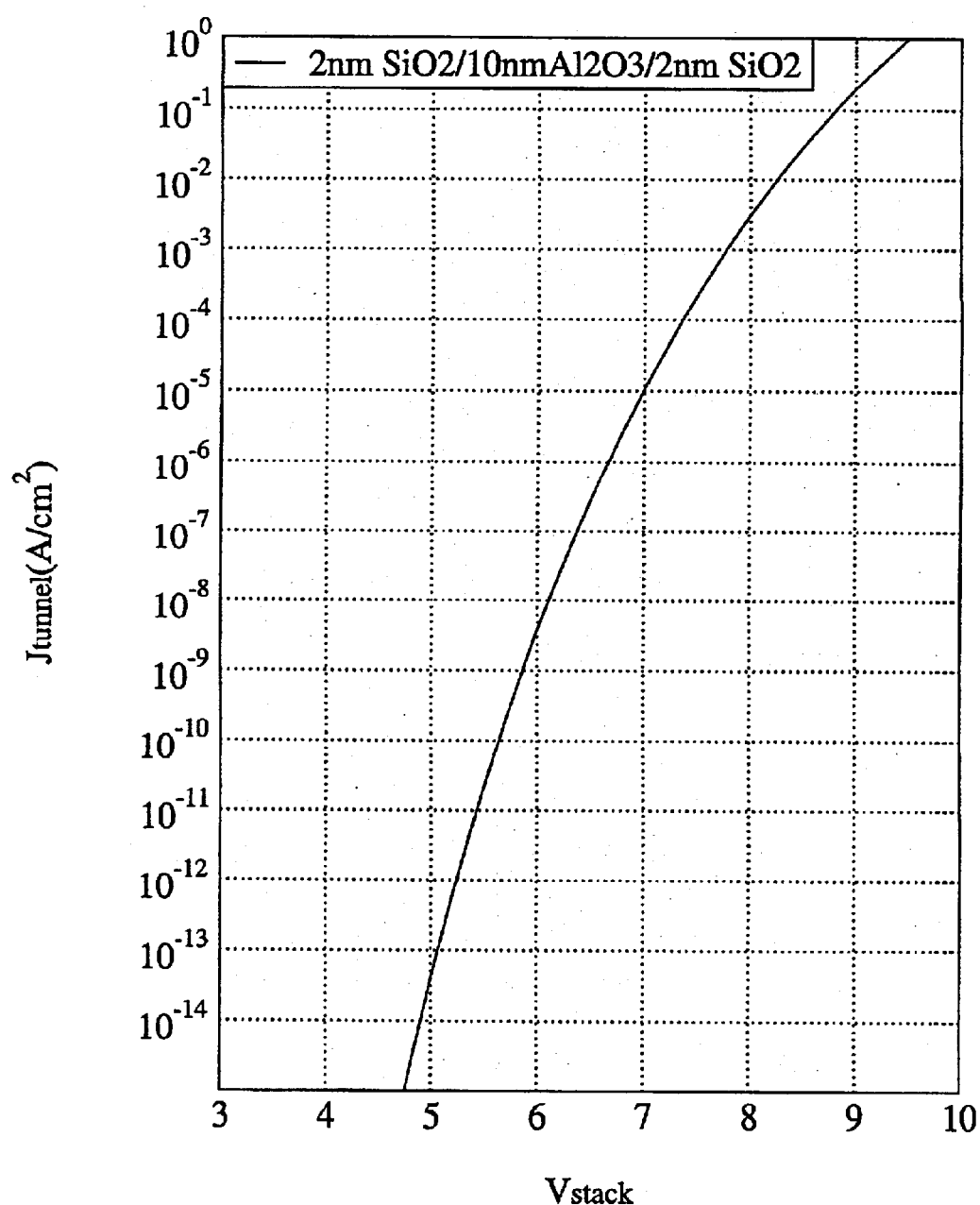
FIG. 10 is a plot of the current-voltage characteristic for the first embodiment.

When applying a voltage over the barrier 20 of FIG. 7, a significant fraction of this voltage will be dropped over the first and third layers 22 and 24 since these layers have a lower dielectric constant than the second layer 23. Consequently, the energy barrier formed by the relatively thick second layer 23 will be lowered. In particular, the construction of the barrier 20 is preferably chosen such that at a voltage suitable for tunnelling, the energy barrier of the second layer 23 is lowered below the electron energy level of the first or second conductive region 21 or 25 (depending on the tunnelling direction), so that the tunnelling current is mostly determined by direct or Fowler-Nordheim tunnelling through the thin first or third layer 22 or 24. For this barrier, the leakage current at low electric fields is mostly determined by the leakage through thicker second layer 23. As can be seen in the voltage-current graph in FIG. 10 and derived from FIG. 8, at low bias, the barrier presented to the charge carriers is sufficient to obtain a low leakage current and thus a sufficient retention time. As can be seen in FIGS. 9 and 10, the tunnelling current at high electric field is determined by the thin first or third dielectric layer, so that a high tunnelling current and thus a short write/erase time can be achieved.

Figure 11:
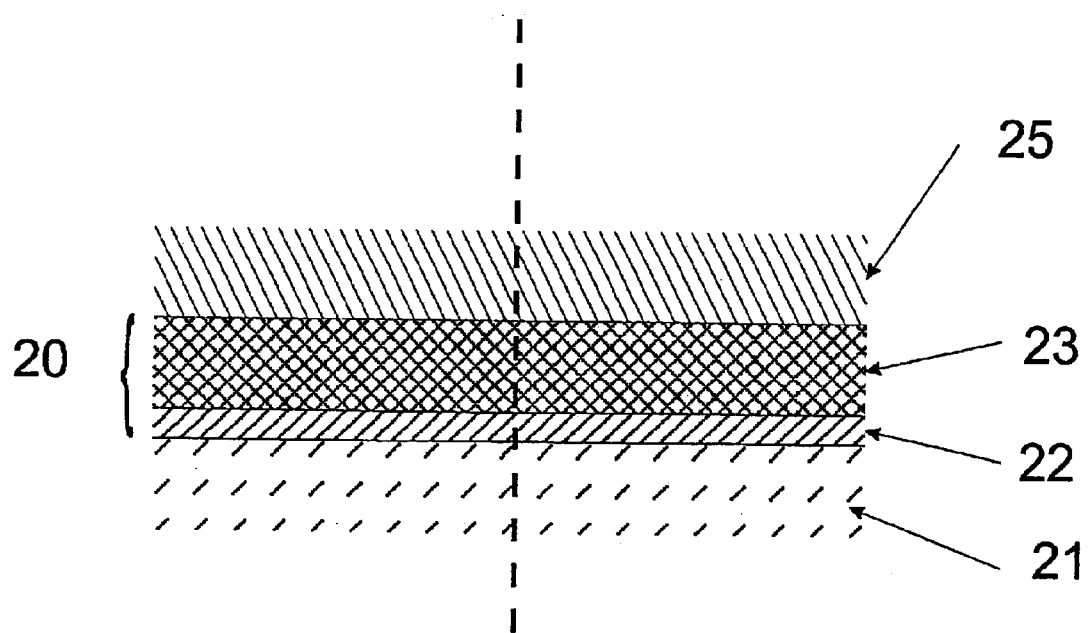
FIG. 11 shows a cross-section of a second embodiment of the insulating barrier according to the invention.

Referring to FIG. 11, a second embodiment of the insulating barrier according to the invention is shown. This second embodiment is preferred if tunnelling in only one direction is required. With this second embodiment, it is possible to obtain a stronger voltage dependence of the current through the insulating barrier and a lower voltage to enable tunnelling as will be illustrated in the following.

The insulating barrier 20 shown in FIG. 11 has a structure similar to that of the first embodiment shown in FIG. 7, with either the first dielectric layer 22 or the third dielectric layer 24 being omitted. For the sake of clarity, the description of this second embodiment will assume that the third dielectric layer 24 is omitted. Obviously, omitting the first layer 22 instead of the third layer 24 essentially leads to the same operation.

The insulating barrier 20 extends between a first conductive region 21 and a second conductive region 25 and comprises first and second layers 22 and 23, which are deposited on top of each other. The first layer 22 is constructed in a first dielectric material having a low dielectric constant. The second layer 23 is substantially wider than the first layer 22 and is constructed in a second dielectric material having a higher dielectric constant than the first dielectric material.

Figure 12:
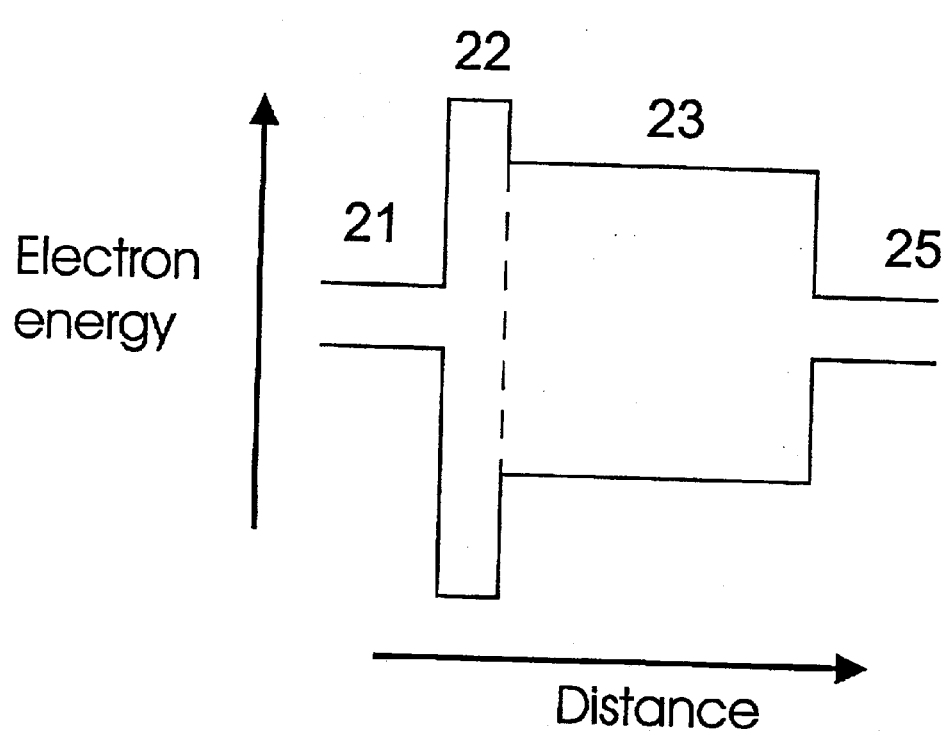
FIG. 12 shows the energy band diagram of the second embodiment when no voltage is applied.
Figure 13:
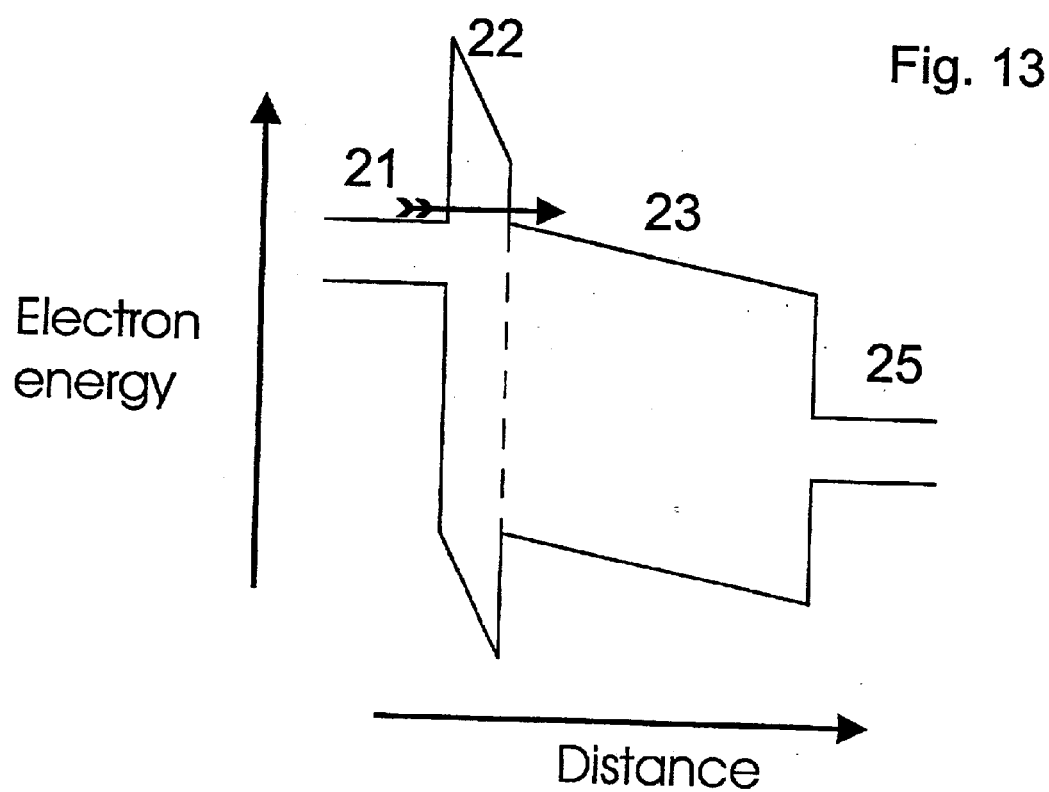
FIG. 13 shows the energy band diagram of the second embodiment when the tunnelling voltage is applied.

The first and second dielectric materials are chosen such that the insulating barrier 20 has an energy band diagram as shown in FIG. 12, when no voltage is applied over the barrier, and as shown in FIG. 13, when the tunnelling voltage is applied over the barrier. In order to achieve the profile shown in FIG. 12, the first and second dielectric materials are chosen such that the first portion 22 has a higher potential energy level than the second portion 23. In order to achieve the profile shown in FIG. 9, the dielectric materials are further chosen such that the first dielectric material has a lower dielectric constant than the second dielectric material and that, upon applying a voltage suitable for tunnelling over the insulating barrier 20, the voltage drop over the first layer 22 is higher than the voltage drop over the second layer 23.

The first and second conductive regions 21 and 25 are constructed in a conductive or semiconductive material. The first conductive region 21 is for example a conductive layer constructed in heavily doped polysilicon (for example degenerately doped polysilicon having a doping concentration of more than $10^{19}/cm^3$), but may also be a semiconductor substrate. If the first conductive region 21 is a polysilicon base layer, it is generally deposited, on top of other material layers, on a semiconductor substrate. The semiconductor substrate typically comprises single crystal silicon.

The first layer 22 with a low dielectric constant is preferably constructed in silicon oxide, or silicon oxynitride with a low nitrogen concentration. The second layer 23 with a high dielectric constant is preferably constructed in a metal oxide like aluminium oxide or zirconium oxide. If the materials used are silicon dioxide for the first layer 22 and aluminium oxide for the second layer 23 the thickness of the first layer 22 is chosen in the range of 1.3–3 nm, preferably 1.5–3 nm.

The thickness of the first layer 22 is at least the thickness of the energy barrier of the second layer 23 divided by the breakdown electrical field of the first layer 22, making it possible to have the energy barrier of the second layer 23 is cancelled. Some examples will clarify this calculation. If the second layer 23 is zirconium oxide having an energy barrier of 2 eV is combined with a first layer 22 of silicon dioxide having a electrical breakdown voltage of about 15 MV/cm, then the minimal thickness for the first layer 22 would be: (2 eV)/(15 MV/cm)=1.33 nm. If the second layer 23 is aluminium oxide having an energy barrier of 2 eV is combined with a first layer 22 of silicon dioxide having a electrical breakdown voltage of about 15 MV/cm, then the minimal thickness for the first layer 22 would be: (3 eV)/(15 MV/cm)=1.5 mn.

The thickness of the second layer 23 is chosen to be sufficient to block the flow of charge carriers when no voltage or a voltage below the maximum read-disturbance voltage is applied over the insulating barrier 20. Typically this thickness is chosen in the range of 6–20 nm. This second layer can for example be deposited by a technique such as atomic layer chemical vapour deposition (ALCVD).

Figure 14:
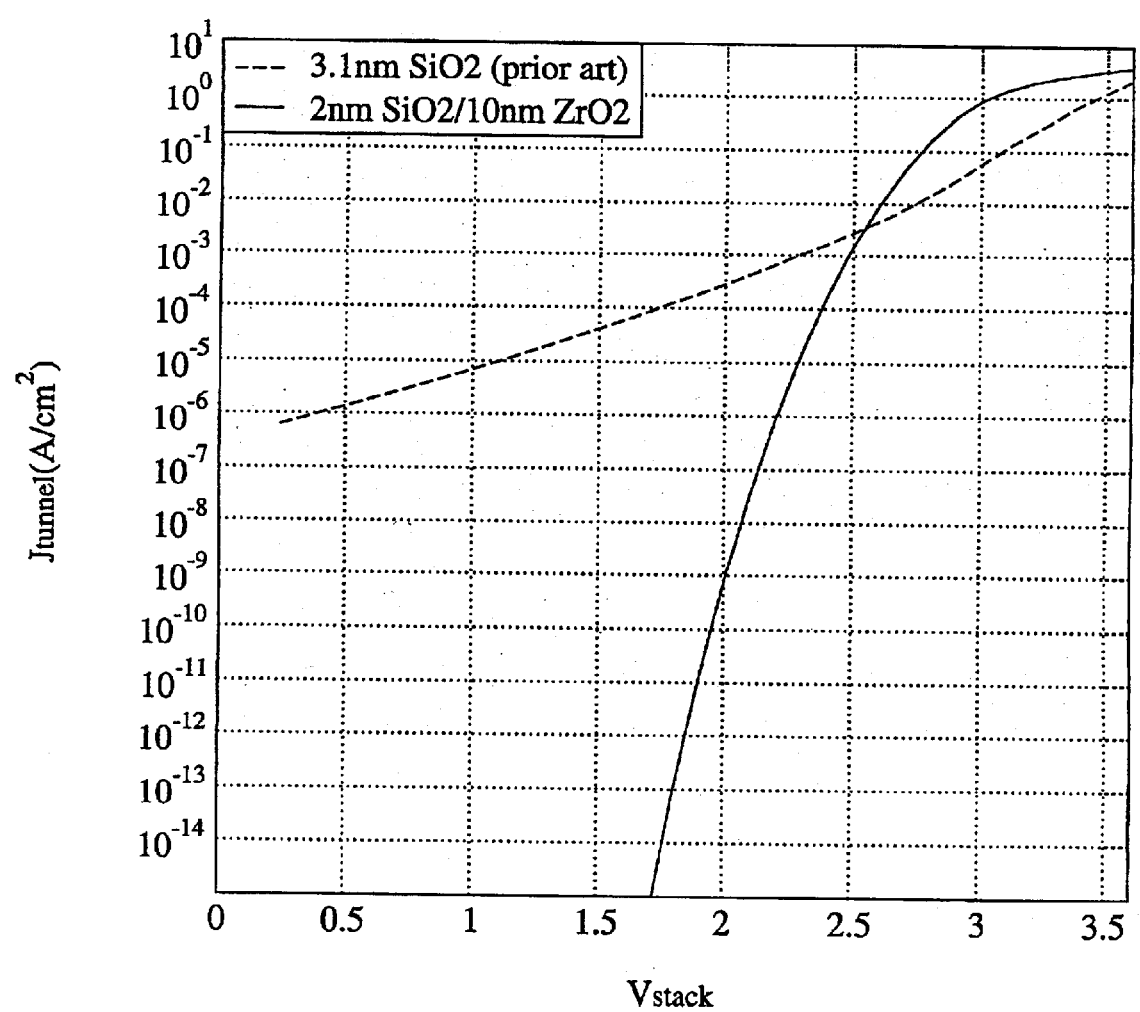
FIG. 14 is a plot of the current-voltage characteristic for the second embodiment.

The operation of the insulating barrier of FIG. 11 is similar to that of the first embodiment of FIG. 7. FIGS. 12 and 13 represent band diagrams of this structure without bias (FIG. 12) and when a high programming voltage is applied (FIG. 13). Although the band diagrams of FIGS. 12 and 13 represent two dielectric materials with a different bandgap (e.g. $SiO_2$ and $ZrO_2$), the same structure would also be valid when using two dielectric materials with approximately the same bandgap (for example the combination of $SiO_2$ and $Al_2O_3$). As can be seen from FIG. 14, the device of this embodiment requires a lower applied voltage to obtain the required barrier lowering in the first layer 22 with a high dielectric constant which enables a high tunnelling current to flow, although the improvement in tunnel current is only applicable in one direction.

In the following, four different embodiments will be described of memory devices comprising the insulating barrier of the invention. Using the insulating barrier of the invention in memory devices enables the memory cells to be written or erased with a lower programming or erase voltage than in the prior art.

Figure 15:
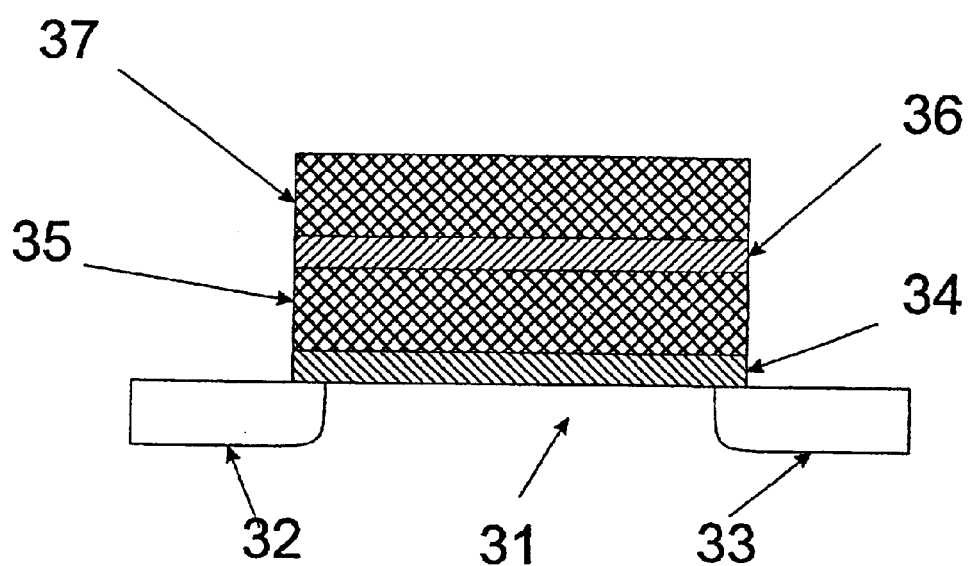
FIG. 15 shows a cross-section of a first memory device comprising an insulating barrier according to the invention.

Referring to FIG. 15, a first memory device is shown. The device comprises a semiconductor substrate with heavily doped regions 32 and 33 which are separated by a channel region 31. A first insulating barrier 34 is formed on top of the semiconductor substrate. This first insulating barrier 34 can for example consist of a single layer of silicon oxide and should have a sufficient thickness to prevent any leakage current to flow through it. This layer can for example be similar to the material stacks that are used in prior art as interpoly dielectric, or can also consist of a single layer of silicon dioxide that is grown on the semiconductor substrate. In the case that this layer consists of silicon dioxide, the thickness of this layer can easily be chosen very thin (e.g. 5–7 nm), since no charge has to be transferred through this layer and therefore it will not suffer of Stress Induced Leakage Current (SILC).

On top of this first insulating barrier 34, a floating gate 35 is formed. This floating gate may for example consist of highly N-type doped polysilicon.

A second insulating barrier 36 is deposited on top of the floating gate layer 35. This second insulating barrier is similar to the insulating barrier according to first embodiment of the invention and as shown in FIG. 7.

A control gate 37 is located on top of the second insulating barrier 36. This control gate 37 may for example consist of highly N-type doped polysilicon.

The information that is stored in the memory cell is determined by the charge on the floating gate 35. The readout of the memory cell can be done by using the control gate 37 and heavily doped regions 32 and 33 as gate, drain and source of the transistor cell. The presence of charge in the floating gate leads to a shift in the threshold voltage of this transistor, i.e. the gate voltage at which the channel region 31 becomes conductive, which can easily be detected.

Writing and erasing of the memory cell is done by tunnelling of charge carriers through the second insulating barrier 36. In order to obtain a sufficiently short write/erase time, a sufficient voltage drop should exist between the floating gate 35 and the control gate 37. The voltage on the floating gate 35 can be set by using the capacitive coupling between the floating gate 35, the control gate 37 and the regions 31, 32 and 33 of the semiconductor substrate. The use of the first embodiment of the insulating barrier according to the invention as second insulating barrier in the memory cell of FIG. 15 enables the writing and erasing of this memory cell at a reduced voltage with respect to the prior art, without adversely affecting the retention time of the cell.

Figure 16:
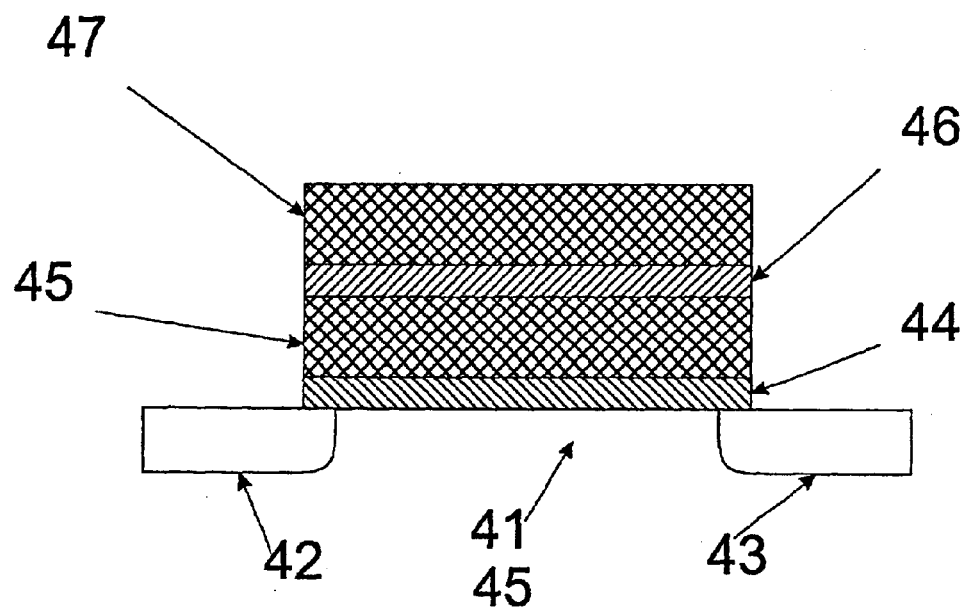
FIG. 16 shows a cross-section of a second memory device comprising an insulating barrier according to the invention.
Figure 17:
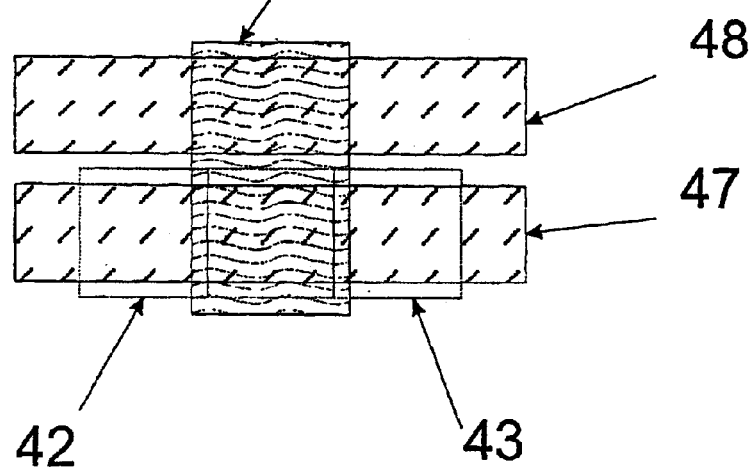
FIG. 17 shows a possible layout for the second memory device.

Referring to FIGS. 16 and 17, a second memory device is shown. The device comprises a semiconductor substrate with heavily doped regions 42 and 43 which are separated by a channel region 41. A first insulating barrier 44 is formed on top of the semiconductor substrate. This insulating barrier 44 is similar to the second embodiment of the insulating barrier of the invention as shown in FIG. 11, with the first layer 22 of dielectric material having a low dielectric constant contacting the substrate. On top of this first insulating barrier 44, a floating gate 45 is deposited. This floating gate 45 may for example consist of highly n-type doped polysilicon. A second insulating barrier 46 is located on top of the floating gate layer 45. This second insulating barrier 46 also corresponds to the second embodiment of the insulating barrier of the invention, with the first layer 22 of dielectric material having a low dielectric constant contacting the floating gate 45. A control gate 47 is located on top of the second insulating barrier 46. This control gate 47 may for example consist of highly n-type doped polysilicon.

The second memory device of FIGS. 16 and 17 further comprises a program gate 48 which is capacitively coupled to the floating gate region 45. This program gate 48 may consist of a different material layer, or may consist of a separated part of the control gate layer 47. This separation between the control gate 47 and the program gate 48 can for example be achieved by a patterning technique like the combination of photolithography and etching.

The information that is stored in the memory cell is determined by the charge on floating gate 45. The readout of the memory cell can be done by using the control gate 47 or program gate 48 and heavily doped regions 42 and 43 as gate, drain and source of the transistor cell. The presence of charge in the floating gate leads to a shift in the threshold voltage of this transistor, i.e. the gate voltage at which the channel region 41 becomes conductive, which can easily be detected.

For the sake of clarity, it is assumed in describing the operation of the memory cell of FIGS. 16 and 17 that electrons are used as charge carriers and that the charge carriers flow from the semiconductor substrate towards the control gate. It is however also possible to assume that holes are used as charge carriers, which implies that opposite polarities have to be used for writing and erasing. This does not imply an essentially different mechanism of operation.

Writing the memory cell (i.e. transporting charge carriers to the floating gate) is done through the first insulating barrier 44 and erasing is done through the second insulating barrier 46. In order to write the memory cell in a sufficiently short time, a sufficiently high voltage difference is applied between the semiconductor substrate and the floating gate region 45. This is achieved by applying a positive voltage relative to the substrate to both the control gate 47 and the program gate 48. Due to the capacitive coupling between the floating gate 45 and both the control gate 47 and program gate 48, the voltage of the floating gate 45 is raised to a substantial fraction of the voltage or voltages applied to control gate 47 and program gate 48. The voltage on the floating gate 45 enables the tunnelling of charge carriers from the semiconductor substrate to the floating gate 45, so that the memory cell can be written.

Similarly, in order to erase the memory cell, a sufficiently high voltage is applied between the floating gate 45 and the control gate region 47. This is achieved by applying a negative voltage relative to the control gate 47 to both the substrate and the program gate 48. Instead of applying a negative voltage to the substrate and the program gate 48, it is also possible to apply a positive voltage to the control gate 47, and a zero or small positive voltage to the substrate and the program gate 48. Due to the capacitive coupling between the floating gate 45 and both the substrate and program gate 48, the voltage of the floating gate remains sufficiently low so that a high voltage difference is obtained between the floating gate 45 and the control gate 47. This enables the tunnelling of charge carriers from the floating gate 45 to the control gate 47, so that the memory cell can be erased.

The memory cell of FIGS. 16 and 17 can be written and erased with a very low tunnelling voltage. Furthermore the current consumption during writing and erasing of the memory cell is low so that this tunnelling voltage can easily be obtained from a lower supply voltage, like for example 1.8 V or lower, by the use of voltage elevation or charge pump circuits which can be constructed on the same semiconductor substrate as the memory cell.

Furthermore, since the tunnelling barriers 44 and 46 are only suitable for transporting charge by tunnelling in one direction, the memory cell can be constructed such that it does substantially not suffer from undesired altering of the content of the memory cell during readout operations. This can be achieved by the use of different gate voltage polarities for writing and reading the memory cell.

Figure 18:
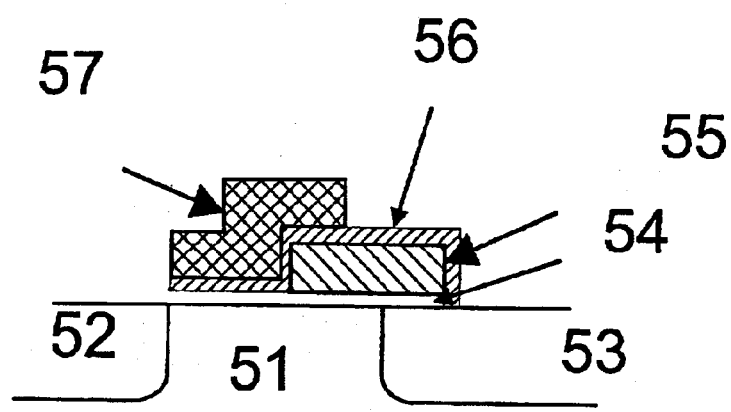
FIGS. 18 and 19 show cross-sections of a third memory device comprising an insulating barrier according to the invention.
Figure 19:
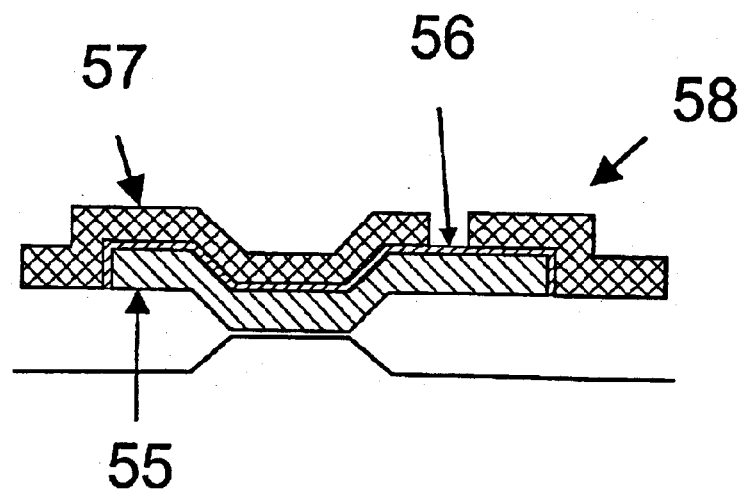
Figure 20:
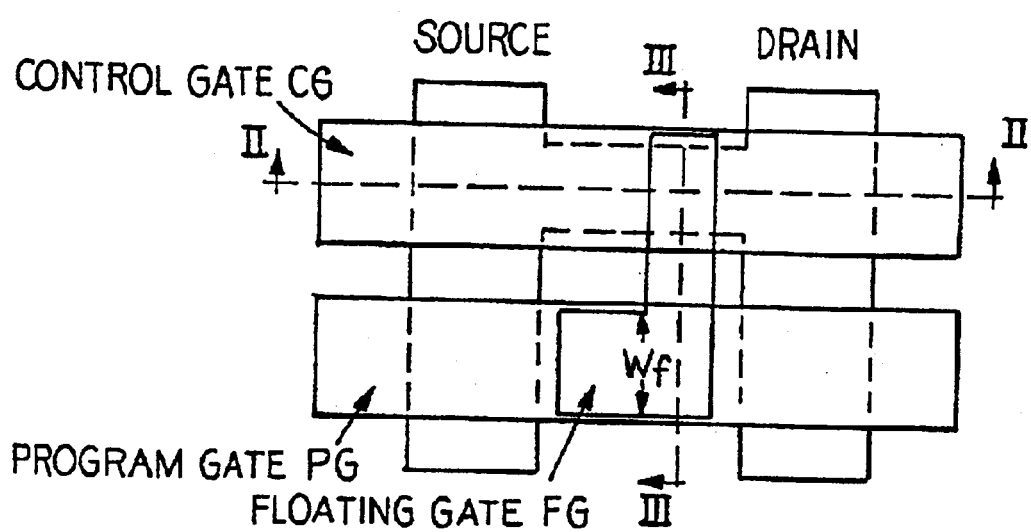
FIG. 20 shows a possible layout for the third memory device.

Referring to FIGS. 18, 19 and 20, a third memory device is shown. In this memory cell, the writing is done by means of hot electron injection, such as is for example known from the HIMOS™ cell which is described in U.S. Pat. No. 5,583,810. However, the interpoly dielectric between the control gate 57 and the floating gate 55 of the HIMOS™ cell is replaced by an insulating barrier 56 according to the second embodiment of the invention as shown in FIG. 11, with the first layer 22 of dielectric material having a high dielectric constant contacting the floating gate 55. This replacement leads to a certain number of important improvements in the operation of the memory cell of FIGS. 18, 19 and 20 with respect to the HIMOS™ cell.

The erasing of the HIMOS™ cell is done by tunnelling of the charge carriers between floating gate and control gate. This tunnelling can either be Fowler-Nordheim tunnelling or tunnelling through a polyoxide where asperities of the underlying layer enhance the electric field and hence the tunnelling current. In both cases, the required erase voltage is always higher than the voltage that is applied to program the device. Replacing the interpoly dielectric by the insulating barrier 56 according to the second embodiment of the invention allows a drastic reduction in the erasing voltage. This reduction of the erase voltage has multiple advantages. The manufacturing flow can be simplified since the difference between the normal transistors and high-voltage transistors becomes smaller. Furthermore, the much less stringent specifications of the high-voltage generation circuitry, and generally the smaller size of high-voltage transistors allow for a considerable circuit area reduction.

Furthermore, the high dielectric constant and low dielectric equivalent oxide thickness of the insulating barrier 56 allows the reduction of the program gate area while still keeping a high coupling ratio between the program gate and the floating gate. This higher coupling ratio between program gate and floating gate also leads to a reduction of the required program voltage.

Since in this third memory device according to the invention, the programming is done by channel hot electron injection through a the first insulating barrier 54 which is for example an oxide layer, only the gate voltages can be reduced. The drain voltage and current requirements remain the same as in the prior art HIMOS™ cell. However, it is also possible to reduce the required drain voltage for hot electron injection, as will appear from the description of a fourth memory device according to the invention, which is given below.

Figure 21:
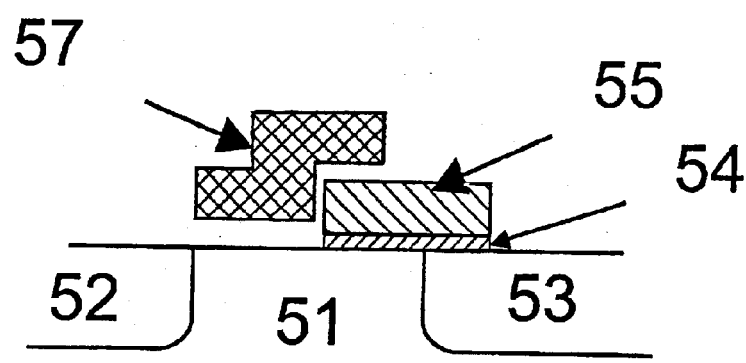
FIGS. 21 and 22 show cross-sections of a fourth memory device comprising an insulating barrier according to the invention.
Figure 22:
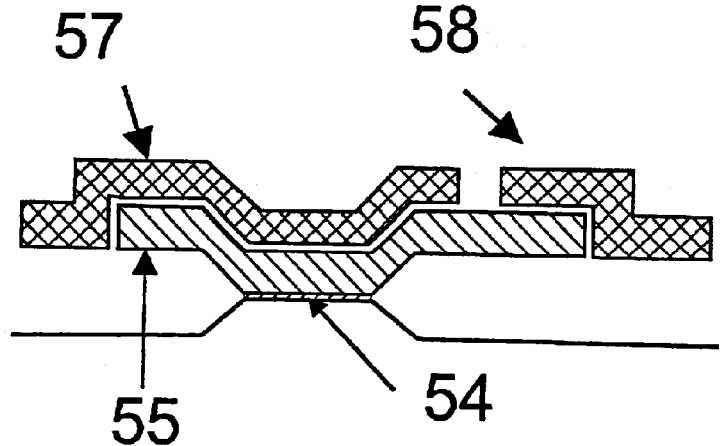

This fourth memory cell is shown in FIGS. 20, 21 and 22. This memory cell also corresponds to the HIIMOS™ cell, but the tunnel oxide 54 of the memory cell is replaced by an insulating barrier 54 according to the second embodiment of the invention, with the first layer 22 of dielectric material with a low dielectric constant contacting the floating gate 55. If a material with a high dielectric constant and a lower bandgap than silicon dioxide is chosen, this barrier 54 allows hot electron injection programming at a lower drain voltage.

The first insulating barrier 54 of this fourth memory cell may for example be a stack consisting of two layers: a thick (8–20 nm) zirconium dioxide layer and a thin (1.5–3 nm) silicon dioxide layer. Preferably, a thin silicon nitride barrier layer (<2 nm) is provided as a diffusion barrier between the zirconium dioxide layer and the substrate in order to prevent oxidation of the silicon in the substrate.

Figure 23:
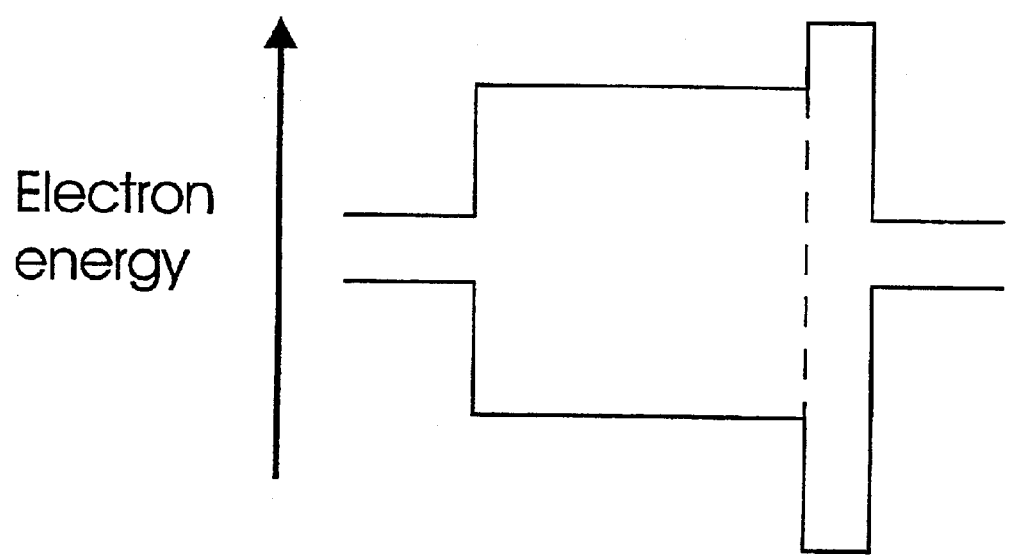
FIG. 23 shows the energy band diagram for the fourth memory device when no voltage is applied across the insulating barrier.
Figure 24:
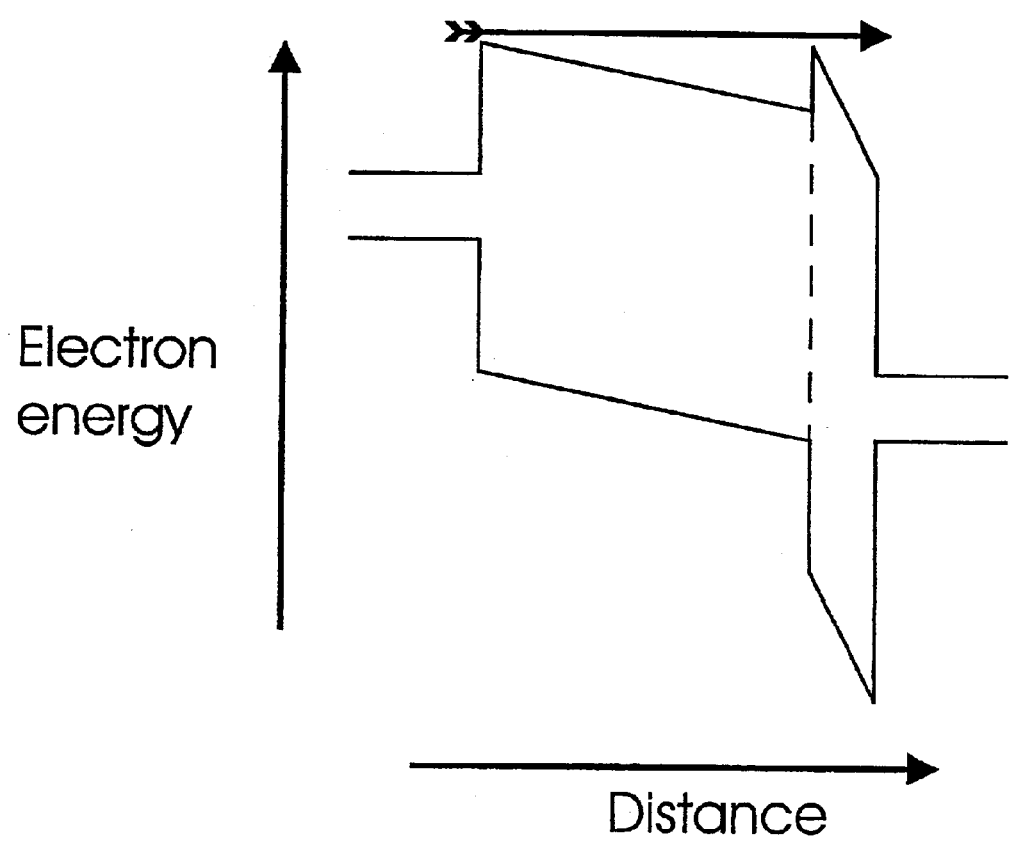
FIG. 24 shows the energy band diagram for the fourth memory device with a bias that is favourable for hot carrier injection.

The replacement of the tunnel oxide by the insulating barrier 54 according to the second embodiment of the invention enables both programming and erasing of the cell with a strongly reduced operating voltage with respect to the HIMOS™ cell. The low barrier height of the dielectric layers with high dielectric constants allows the use of a low drain voltage for the writing by hot carrier injection. The effect of a higher energy barrier of the silicon dioxide layer can be compensated by applying a positive voltage to the program gate 58. This is illustrated in FIGS. 23 and 24. The barrier composition as described in the second embodiment of this invention allows efficient low-voltage tunnelling for erasure. Therefore, the entire write/erase functionality of the memory cell can be achieved with a lower power supply voltage, and a sufficient data retention time can still be achieved because of the large physical thickness of the dielectric stack.

The four memory devices described above only refer to a floating gate for charge storage. However, the insulating barriers of the invention may also be applied in other than floating gate memory cells, such as for example memory devices using silicon nanocrystals or traps in a silicon nitride layer as charge storage sites.

What is claimed is:

1. An insulating barrier extending between a first conductive region and a second conductive region, the insulating barrier for tunneling charge carriers from the first conductive region to the second conductive region, the insulating barrier comprising:
    a first portion contacting the first region; and
    a second portion contacting the first portion and extending towards the second region,
    wherein the first portion is substantially thinner than the second portion, the first portion comprising one or more dielectric materials for tunneling charge carriers and the second portion comprising one or more dielectric materials for tunneling charge carriers that are different than the one or more dielectric materials of the first portion, characterized in the one or more dielectric materials of the first portion having lower dielectric constants than the one or more dielectric materials of the second portion.

2. The insulating barrier according to claim 1, wherein the one or more dielectric materials of the first and second portions, and the thickness of the first and second portions are chosen such that, upon applying a voltage suitable for tunneling charge carriers through the insulating barrier, the voltage drop across the first portion is higher than the voltage drop across the second portion.

3. The insulating barrier according to claim 2, wherein the insulating barrier is provided tunneling charge carriers, which are communicated from the second conductive region to the first conductive region, and
    the insulating barrier further comprises a third portion extending between the second portion and the second region, the third portion being substantially thinner than the second portion and comprising one or more dielectric materials that are different than the one or more dielectric materials of the second portion, characterized in the one or more dielectric materials of the third portion having lower dielectric constants than the one or more dielectric materials of the second portion.

4. The insulating barrier according to claim 3, wherein the third portion has substantially the same thickness as the first portion and the one or more dielectric materials of the third portion are substantially the same as the one or more dielectric materials of the first portion.

5. The insulating barrier according to claim 4, wherein the one or more dielectric materials of the first, second and third portions are chosen such that, in absence of a voltage potential applied across the insulating barrier, the first, second and third portions have substantially the same potential energy barrier.

6. The insulating barrier according to claim 5, wherein insulating barrier is constructed as a three-layered structure, and
    wherein the first and third portions comprise $SiO_2$ and the second portion comprises $Al_2O_3$.

7. The insulating barrier according to claim 2, wherein the one or more dielectric materials of the first and second portions are chosen such that, in absence of a voltage potential applied across the insulating barrier, the first portion has a higher potential energy barrier than the second portion.

8. The insulating barrier according to claim 7, wherein the insulating barrier is constructed as a two-layered structure, and wherein the first portion comprises one of SiO$_2$ and Si$_3$N$_4$ and the second portion comprises one of HfO$_2$ and ZrO$_2$.

9. A memory device comprising an insulating barrier, the insulating barrier comprising:
a first portion contacting a first conductive first region of the memory device; and
a second portion contacting the first portion and extending towards a second conductive region of the memory device,
wherein the first portion is substantially thinner than the second portion, the first portion comprising one or more dielectric materials and the second portion comprising one or more dielectric materials that are different than the one or more dielectric materials of the first portion, characterized in the one or more dielectric materials of the first portion having lower dielectric constants than the one or more dielectric materials of the second portion.

10. A memory device comprising:
a semiconductor substrate having two heavily doped regions which are spaced by a channel region;
a first insulating barrier on top of the channel region;
a floating gate on top of the first insulating barrier;
a second insulating barrier on top of the floating gate; and
a control gate on top of the second insulating barrier,
wherein the second insulating barrier comprises:
a first portion contacting the floating gate; and
a second portion contacting the first portion and extending towards the control gate,
wherein the first portion is substantially thinner than the second portion, the first portion comprising one or more dielectric materials and the second portion comprising one or more dielectric materials that are different than the one or more dielectric materials of the first portion, characterized in the one or more dielectric materials of the first portion having lower dielectric constants than the one or more dielectric materials of the second portion, and
wherein the one or more dielectric materials of the first and second portions and the thickness of the first and second portions are chosen such that, upon applying a voltage suitable for tunneling charge carriers through the second insulating barrier, the voltage drop across the first portion is higher than the voltage drop across the second portion.

11. The memory device of claim 10, wherein the second insulating barrier is provided tunneling charge carriers, which are communicated from the control gate to the floating gate, and
the second insulating barrier further comprises a third portion extending between the second portion and the control gate, the third portion being substantially thinner than the second portion and comprising one or more dielectric materials that are different than the one or more dielectric materials of the second portion, characterized in that the one ore more dielectric materials of the third portion have lower dielectric constants than the one or more dielectric materials of the second portion.

12. The memory device of claim 10, further comprising a program gate which is capacitively coupled to the floating gate,
wherein the first insulating barriers comprises:
a first portion contacting the substrate; and
a second portion contacting the first portion of the first insulating barrier and extending towards the floating gate,
wherein the first portion of the first insulating barrier is substantially thinner than the second portion of the first insulating barrier, the first portion of the first insulating barrier comprising one or more dielectric materials and the second portion of the first insulating barrier comprising one or more dielectric materials that are different than the one or more dielectric materials of the first portion of the first insulating barrier, characterized in that the one or more dielectric materials of the first portion of the first insulating barrier have lower dielectric constants than the one or more dielectric materials of the second portion of the first insulating barrier,
wherein the one or more dielectric materials of the first and second portions of the first insulating barrier and the thickness of the first and second portions of the first insulating barrier are chosen such that, upon applying a voltage suitable for tunneling charge carriers through the first insulating barrier, the voltage drop across the first portion of the first insulating barrier is higher than the voltage drop across the second portion of the first insulating barrier, and
wherein the one or more dielectric materials of the first and second portions of the first insulating barrier are chosen such that, in absence of a voltage potential applied across the first insulating barrier, the first portion of the first insulating barrier has a higher potential energy barrier than the second portion of the first insulating barrier.

13. The memory device of claim 10, further comprising a program gate which is capacitively coupled to the floating gate,
wherein the first insulating barrier extends over a portion of the channel region and over a portion of the first heavily doped region,
wherein the floating gate is on top of the first insulating barrier,
wherein the second insulating barrier extends over the floating gate and over a portion of the channel region not covered by the first insulating barrier, and
wherein the one or more dielectric materials of the first and second portions are chosen such that, in absence of a voltage potential applied across the second insulating barrier, the first portion has a higher potential energy barrier than the second portion.

14. The memory device of claim 10, further comprising a program gate which is capacitively coupled to the floating gate, and
wherein the two heavily doped regions comprise first and second heavily doped regions,
wherein the first insulating barrier extends over a portion of the channel region and over a portion of the first heavily doped region,
wherein the second insulating barrier extends over the floating gate and over a portion of the channel region not covered by the first insulating barrier, and
wherein the first insulating barrier comprises:
a first portion contacting the substrate; and
a second portion contacting the first portion of the first insulating barrier and extending towards the floating gate,
wherein the first portion of the first insulating barrier is substantially thinner than the second portion of the first insulating barrier, the first portion of the first insulating barrier comprising one or more dielectric materials and the second portion of the first insulating barrier comprising one or more dielectric materials that are different than the one or more dielectric materials of the first portion of the first insulating barrier, characterized in the one or more dielectric materials of the first portion of the first insulating barrier having lower dielectric constants than one or more dielectric materials of the second portion of the first insulating barrier, wherein the one or more dielectric materials of the first and second portions of the first insulating barrier and the thickness of the first and second portions of the first insulating barrier are chosen such that, upon applying a voltage suitable for tunneling charge carriers through the first insulating barrier, the voltage drop across the first portion of the first insulating barrier is higher than the voltage drop across the second portion of the first insulating barrier, and wherein the one or more dielectric materials of the first and second portions of the first insulating barrier are chosen such that, in absence of a voltage potential applied across the first insulating barrier, the first portion of the first insulating barrier has a higher potential energy barrier than the second portion of the first insulating barrier.

* * * * *